United States Patent
Chang et al.

(10) Patent No.: US 10,153,338 B2
(45) Date of Patent: Dec. 11, 2018

(54) METHOD OF MANUFACTURING A CAPACITOR

(71) Applicant: TAIWAN SEMICONDUCTOR MANUFACTURING COMPANY, LTD., Hsinchu (TW)

(72) Inventors: Chun Hua Chang, Zhubei (TW); Der-Chyang Yeh, Hsinchu (TW); Kuang-Wei Cheng, Hsinchu (TW); Yuan-Hung Liu, Hsinchu (TW); Shang-Yun Hou, Jubei (TW); Wen-Chih Chiou, Miaoli (TW); Shin-Puu Jeng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 15/497,594

(22) Filed: Apr. 26, 2017

(65) Prior Publication Data

US 2017/0229534 A1   Aug. 10, 2017

Related U.S. Application Data

(60) Continuation of application No. 14/515,368, filed on Oct. 15, 2014, now Pat. No. 9,660,016, which is a
(Continued)

(51) Int. Cl.
*H01L 21/20* (2006.01)
*H01L 49/02* (2006.01)
(Continued)

(52) U.S. Cl.
CPC ........ *H01L 28/60* (2013.01); *H01L 21/76832* (2013.01); *H01L 21/76846* (2013.01);
(Continued)

(58) Field of Classification Search
CPC .............................. H01L 28/40; H01L 21/768
(Continued)

(56) References Cited

U.S. PATENT DOCUMENTS

| 5,976,928 A | 11/1999 | Kirlin et al. |
| 6,407,929 B1 | 6/2002 | Hale et al. |

(Continued)

FOREIGN PATENT DOCUMENTS

| KR | 2001-0032312 | 4/2001 |
| KR | 1020030070600 | 8/2003 |

(Continued)

OTHER PUBLICATIONS

Office Action dated May 20, 2014 and English Translation from corresponding application No. KR 10-2012-0109905.
(Continued)

*Primary Examiner* — Theresa T Doan
(74) *Attorney, Agent, or Firm* — Hauptman Ham, LLP

(57) ABSTRACT

A method of forming a device includes forming a through via extending into a substrate. The method further includes forming a first insulating layer over the surface of the substrate. The method further includes forming a first metallization layer in the first insulating layer and electrically connected to the through via. The method further includes forming a capacitor over the first metallization layer, wherein the capacitor comprises a first capacitor dielectric layer and a second capacitor dielectric layer. The method further includes depositing a continuous second insulating layer over the first insulating layer. The capacitor is within the second insulating layer. The method further includes depositing a third insulating layer over the second insulating layer. The method further includes forming a second met-
(Continued)

allization layer in the third insulating layer. A bottom surface of the second metallization layer is below a bottom surface of the third insulating layer.

20 Claims, 4 Drawing Sheets

Related U.S. Application Data division of application No. 13/485,340, filed on May 31, 2012, now Pat. No. 8,878,338.

(51) Int. Cl.
    *H01L 21/768*     (2006.01)
    *H01L 23/522*     (2006.01)
    *H01L 23/532*     (2006.01)
    *H01L 23/528*     (2006.01)

(52) U.S. Cl.
    CPC .... *H01L 21/76877* (2013.01); *H01L 23/5223* (2013.01); *H01L 23/5226* (2013.01); *H01L 23/5283* (2013.01); *H01L 23/53228* (2013.01); *H01L 23/53295* (2013.01)

(58) Field of Classification Search
    USPC ........................................................ 438/393
    See application file for complete search history.

(56) References Cited

U.S. PATENT DOCUMENTS

| | | | |
|---|---|---|---|
| 7,435,627 B2 | 10/2008 | Horton et al. | |
| 7,518,881 B2 | 4/2009 | Cornelius | |
| 7,678,688 B2 * | 3/2010 | Choi | H01L 21/76801 257/E21.482 |
| 7,846,852 B2 | 12/2010 | Shioga et al. | |
| 7,851,322 B2 | 12/2010 | Chiang | |
| 2002/0094656 A1 | 7/2002 | Armacost et al. | |
| 2003/0197215 A1 | 10/2003 | Coolbaugh et al. | |
| 2006/0138595 A1 * | 6/2006 | Kiyotoshi | H01L 21/8221 257/532 |
| 2008/0296697 A1 | 12/2008 | Hsu et al. | |
| 2010/0044089 A1 | 2/2010 | Shibuya et al. | |
| 2010/0213600 A1 | 8/2010 | Lau et al. | |
| 2010/0233359 A1 | 9/2010 | Shioga et al. | |
| 2011/0068444 A1 | 3/2011 | Chi et al. | |
| 2012/0319239 A1 * | 12/2012 | Chang | H01L 23/481 257/532 |
| 2013/0285200 A1 | 10/2013 | Chang et al. | |

FOREIGN PATENT DOCUMENTS

| | | |
|---|---|---|
| KR | 1020100041220 | 4/2010 |
| TW | 201123397 | 7/2011 |

OTHER PUBLICATIONS

Office Action dated Oct. 28, 2013 with English translation from corresponding application No. KR 10-2012-0109905.
Notice of Allowance dated Dec. 15, 2014 and English translation from corresponding application No. KR 10-2012-0109905.
Office Action dated Mar. 16, 2016 from corresponding application No. CN 201210425190.2.

* cited by examiner

METHOD OF MANUFACTURING A CAPACITOR

PRIORITY CLAIM

The present application is a continuation of U.S. application Ser. No. 14/515,368, filed Oct. 15, 2014, which is a divisional of U.S. application Ser. No. 13/485,340, filed May 31, 2012, now U.S. Pat. No. 8,878,338, issued Nov. 4, 2014, which are incorporated herein by reference in their entireties.

BACKGROUND

Semiconductor devices are used in a variety of electronic applications, such as personal computers, cell phones, digital cameras, and other electronic equipment, as examples. The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area than packages of the past, in some applications. One type of smaller packaging that has been developed is three-dimensional (3D) ICs, in which two die or ICs are bonded together and electrical connections are formed between the die and contact pads on an interposer.

In these situations, power and signal lines may be passed through the interposer, from connections on one side of the interposer to dies or other electrical connections on an opposing side of the interposer. The interposer may also include passive components, such as a decoupling capacitor. The current from a power supply flows through the power lines, logic gates, and finally to ground. During the switching of the logic gates, a large amount of change in the current may occur within a short period of time. Decoupling capacitors are used to absorb these glitches during current switching. Decoupling capacitors function as charge reservoirs by maintaining a constant voltage between the supply voltage and ground, preventing momentary drops in the supplied voltage.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

Embodiments of the present disclosure are related to packages for semiconductor devices that utilize an interposer as a component, such as 3DICs. Methods of forming interposers having capacitors formed thereon, such as metal-insulator-metal (MIM) capacitors (e.g., decoupling capacitors), will be described herein.

Figure 1:
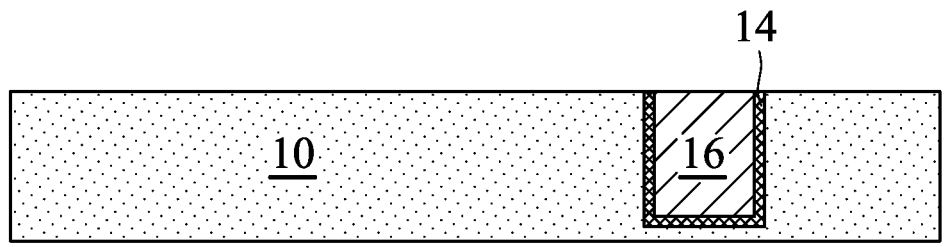
FIGS. 1-7 are cross-sectional views of various intermediate stages of forming a device in accordance with an embodiment.

Referring first to FIG. 1, there is shown a cross-sectional view of a substrate 10 in accordance with an embodiment. The substrate 10 may be any suitable substrate, such as a silicon substrate, a 1/2/1 laminate substrate, a 4-layer laminate substrate, a ceramic substrate, or the like. While the embodiments discussed herein are described in the specific context of an interposer to be used to mount one or more integrated circuits thereto, other embodiments may utilize aspects of the present disclosure in other situations.

One or more openings, such as opening 12, are formed in the substrate 10. As will be discussed in greater detail below, the opening 12 will be subsequently filled with a conductive material to form through vias (TVs). As illustrated in FIG. 1, in an embodiment the opening 12 extends partially into the substrate 10. Subsequent processing may be performed to thin the backside of the substrate 10 to expose and form electrical connections to the TVs.

The opening 12 may be formed by, for example, etching, milling, laser techniques, a combination thereof, and/or the like recesses from a top surface 10a of the substrate 10. For example, in an embodiment, photolithography techniques may be used. Generally, photolithography involves depositing a photoresist material, which is then masked, exposed, and developed, thereby leaving the section of the substrate 10 that is to become the opening 12 exposed. After the photoresist material is patterned, an etching process may be performed to form the opening 12 in the substrate 10 as illustrated in FIG. 1. In an embodiment in which the substrate 10 includes a silicon interposer, the etching process may be a wet or dry, anisotropic or isotropic, etch process. After the opening 12 is formed, the photoresist material may be removed using, for example, an ashing process.

After the opening 12 is formed, a liner 14 may be deposited over the surface of the substrate 10, such as by chemical vapor deposition (CVD), atomic layer deposition (ALD), physical vapor deposition (PVD), thermal oxidation, a combination thereof, and/or the like. The liner may include an oxide, such as $SiO_2$, a nitride, such as $Si_3N_4$, SiC, SiON, or TiN, or other dielectric materials.

The opening 12 is filled with a conductive material, thereby forming TV 16 in accordance with an embodiment. The TV 16 may be formed, for example, by depositing a layer of the conductive material over the liner 14 and within the opening 12. The conductive material may be formed by an electro-chemical plating process, CVD, ALD, PVD, a combination thereof, and/or the like. Examples of conductive materials include copper, tungsten, aluminum, silver, gold, a combination thereof, and/or the like. Excess conductive material may be removed by, for example, a planarization process, such as a chemical mechanical polishing (CMP) process, using the liner 14 as a stop layer, thereby forming the TV 16 as illustrated in FIG. 1.

Figure 2:
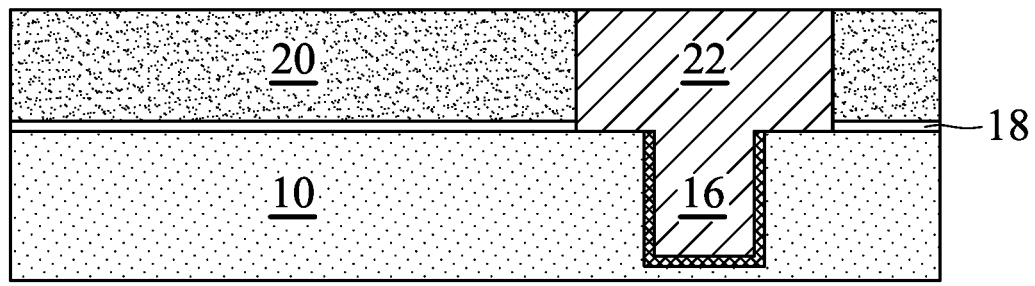

Referring now to FIG. 2, there is shown a first etch stop layer 18 and a first insulating layer 20 formed over the substrate 10 in accordance with an embodiment. The first etch stop layer 18 and the first insulating layer 20 act as a dielectric layer in which metallization layers may be subsequently formed. The first etch stop layer 18 provides an etch stop during later processing, such as forming electrical connections to the TV 16. In an embodiment, the first etch stop layer 18 may be formed of a dielectric material such as a silicon-containing material, a nitrogen-containing material, an oxygen-containing material, a carbon-containing material or the like. The first insulating layer 20 may include a dielectric or low-k dielectric layer. For example, in an embodiment the first insulating layer 20 is formed of $SiO_2$, borophosphosilicate glass (BPSG), tetraethylorthosilicate (TEOS), high density plasma (HDP) oxide, spin on glass (SOG), undoped silica glass (USG), fluorinated silica glass (FSG), BLACK DIAMOND™ (Applied Materials of Santa Clara, Calif.), or other insulating materials.

FIG. 2 also illustrates formation of a first metallization (M1) layer 22 interconnecting the TV 16 and/or components formed on the substrate 10 in accordance with an embodiment. In some embodiments, the first metallization layer 22 may provide an electrical connection to the capacitor formed in subsequent processes. Openings corresponding to the first metallization layer 22 may be formed in the first insulating layer 20 and the first etch stop layer 18 using for example, a damascene process. Conductive material is deposited over the first insulating layer 20 and the first etch stop layer 18 to fill the openings. Excess conductive material may be removed using one or more etch processes or CMP processes, leaving the structure shown in FIG. 2. In an embodiment, the conductive material used to form the first metallization layer 22 may include, for example, aluminum, copper, tungsten, combinations thereof, or the like. A barrier and/or liner (not shown) may also be formed in the opening prior to the formation of the first metallization layer 22.

Figure 3:
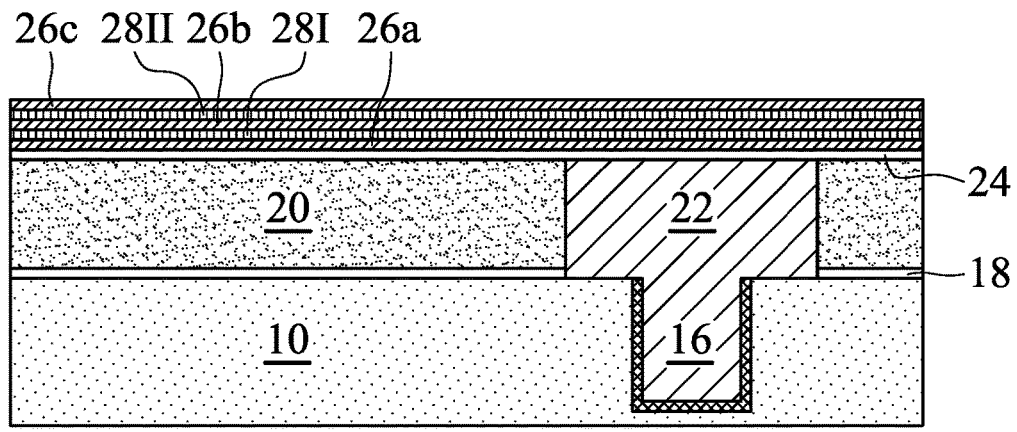

FIG. 3 illustrates forming a second etch stop layer 24 and material layers over the first metallization layer 22 and the first insulating layer 20, and the material layers are to be subsequently patterned to become MIM capacitors, e.g., electrode layers 26 and capacitor dielectric material layers 28, in accordance with an embodiment. In an embodiment, the electrode layers 26 include a first electrode layer 26*a*, a second electrode layer 26*b* and a third electrode layer 26*c*, and the capacitor dielectric layers 28 include a first capacitor dielectric layer 28I and a second capacitor dielectric layer 28II. In an embodiment, the first capacitor dielectric layer 28I is formed between the layers 26*a* and 26*b*, and the second capacitor dielectric layer 28II is formed between the layers 26*b* and 26*c*. The electrode layers 26 may include a layer of conductive material such as TaN, TiN, or the like, for example, although other materials may be used. The capacitor dielectric material layers 28 may include a high dielectric constant (k) material having a dielectric constant greater than the dielectric constant of $SiO_2$, for example, such as ZrO, HfO, $Si_3N_4$, or barium strontium titanate (BST), although other materials may be used.

The second etch stop layer 24 provides an etch stop during later processing, such as forming MIM capacitors, as well as providing an additional isolation layer between the subsequently formed capacitor and the first metallization layer 22. In an embodiment, the second etch stop layer 24 may be formed of a dielectric material such as a silicon-containing material, a nitrogen-containing material, an oxygen-containing material, a carbon-containing material or the like. The first etch stop layer 18 and the second etch stop layer 24 may be formed of a same type of material or a different type of material.

Figure 4:
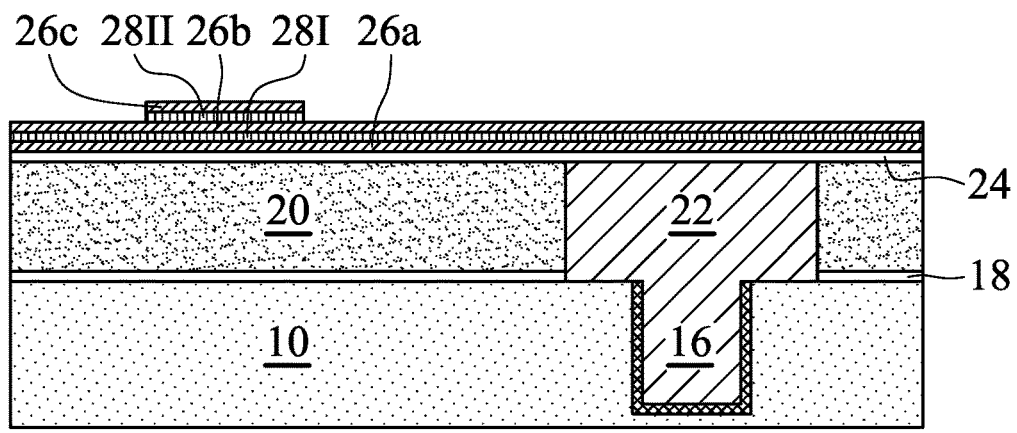
Figure 5:
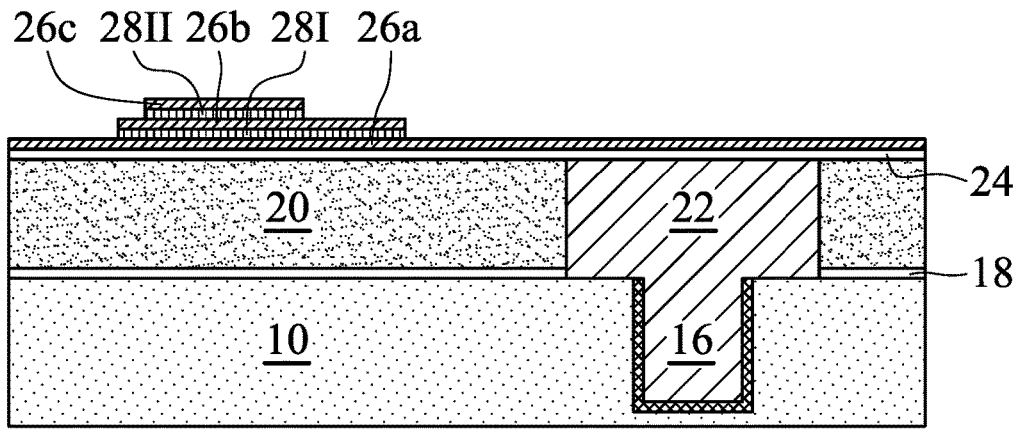
Figure 6:
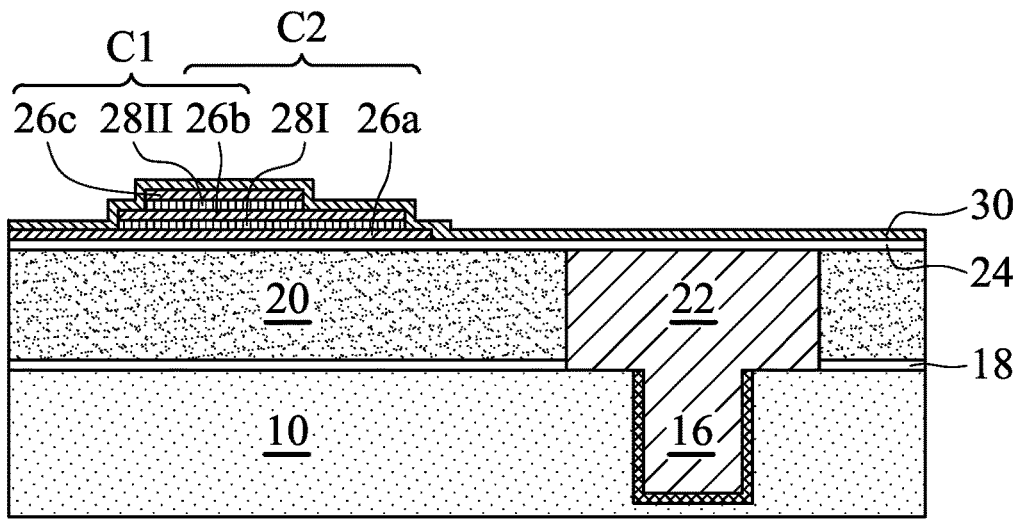

Next, referring to FIG. 4, the third electrode layer 26*c* and the second capacitor dielectric layer 28II are etched through one or more photolithography processes as a first pattern. Then, the second electrode layer 26*b* and the first capacitor dielectric layer 28I are etched through one or more photolithography processes as a second pattern, as shown in FIG. 5. Thereafter, as shown in FIG. 6, the first electrode layer 26*a* is etched through one or more photolithography processes as a third pattern. The patterned layers 26*a*, 28I and 26*b* forms a first capacitor C1, and the patterned layers 26*b*, 28II and 26*c* forms a second capacitor C2 in accordance with an embodiment. The first capacitor C1 and the second capacitor C2 may have the same or different dimensions. In an embodiment, the first pattern is smaller than the second pattern, and the second pattern is smaller than the third pattern. In some embodiments, the first pattern, the second pattern and the third pattern have similar dimensions.

In an embodiment, the first capacitor C1 includes a MIM capacitor, although other types of materials may be used. In an embodiment, the second capacitor C2 includes a MIM capacitor, although other types of materials may be used. In the embodiment illustrated in FIG. 6, in the first capacitor C1, the bottom electrode extends beyond the lateral boundaries of the top electrode. In the embodiment illustrated in FIG. 6, in the second capacitor C2, the bottom electrode extends beyond the lateral boundaries of the top electrode. In this manner, electrical contact may be made to the bottom electrode from above as discussed in greater detail below. The stacked capacitors C1 and C2 forms the capacitor with dual capacitor dielectric layers 28I and 28II, which can increase capacitance to sustain chips with high performance.

FIG. 6 also illustrates the formation of a capping layer 30 on the capacitors C1 and C2 and the second etch stop layer 24. In an embodiment, the capping layer 30 is formed of a dielectric material such as a silicon-containing material, a nitrogen-containing material, an oxygen-containing material, a carbon-containing material, or the like.

Figure 7:
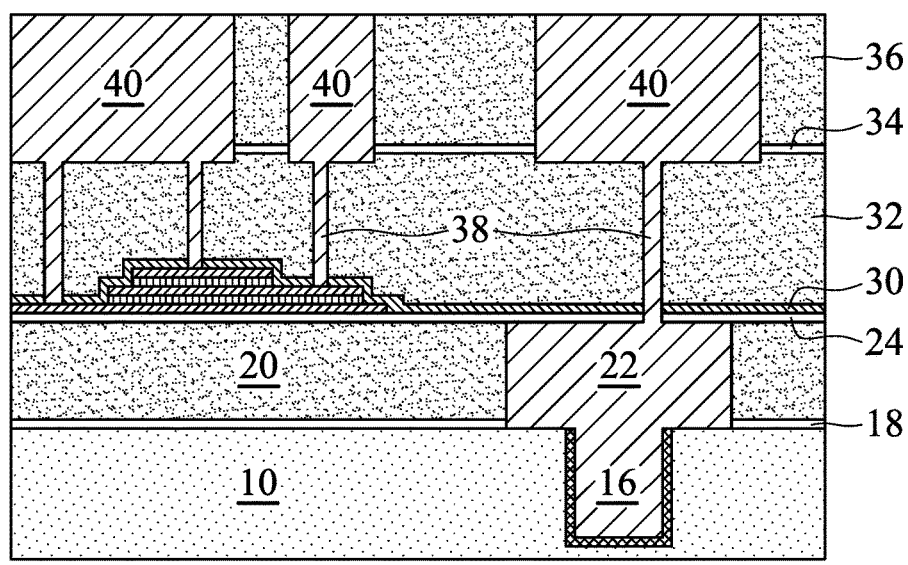

Referring now to FIG. 7, there is shown a second insulating layer 32, a third etch stop layer 34, and a third insulating layer 36 formed over the capping layer 30 in accordance with an embodiment. The second insulating layer 32, the third etch stop layer 34, and the third insulating layer 36 act as a dielectric layer in which metallization layers may be subsequently formed. The second insulating layer 32 and the third insulating layer 36 may include a dielectric or low-k dielectric layer. For example, in an embodiment the second insulating layer 32 and the third insulating layer 36 may include $SiO_2$, BPSG, TEOS, HDP oxide, SOG, USG, FSG, BLACK DIAMOND™, or other insulating materials. The second insulating layer 32 and the third insulating layer 36 may be formed of a same type of material or a different type of material. The third etch stop layer 34 may be formed of a dielectric material having a high etch selectivity with the material or materials used to form the second insulating layer 32 and the third insulating layer 36. For example, the third etch stop layer 34 may include a nitride such as $Si_3N_4$, SiC, SiON, TiN, or other dielectric materials.

Next, a second metallization (M2) layer 40 and via plugs 38 interconnecting the first metallization layer 22 with components are formed on the substrate 10 in accordance with an embodiment. As illustrated in FIG. 7, the second metallization layer 40 and via plugs 38 provide an electrical connection to the electrodes of the capacitors C1 and C2. In an embodiment, the via plugs 38 electrically connect the electrodes 26*a*, 26*b* and 26*c* of the stacked capacitors C1 and C2, respectively. Openings corresponding to the second metallization layer 40 and via plugs 38 may be formed in the second insulating layer 32 and the third insulating layer 36 using, for example, a dual damascene process. Conductive material is deposited over the second insulating layer 32 and the third insulating layer 36 to fill the openings. Excess conductive material may be removed using one or more etch processes or CMP processes, leaving the structure shown in FIG. 7. In an embodiment, the conductive material used to form the second metallization layer 40 and via plugs 38 may include, for example, aluminum, copper, tungsten, combinations thereof, or the like. A barrier and/or liner (not shown) may also be used.

Thereafter, other processing steps may be performed, such as, forming additional metallization layers, forming external contacts, thinning a backside of the substrate, attaching one or more dies to the substrate, attaching the substrate to another substrate (e.g., printed circuit board, another interposer, packaging substrate, etc.), and the like.

As can be appreciated, embodiments such as those disclosed herein provide a capacitor integrated on a substrate, such as an interposer, that may avoid issues related to thickness variations that may be caused by an underlying metal feature. For example, by placing the capacitor on the substrate, a more planar surface may be obtained upon which the capacitor may be formed. The metallization layers may be characterized by ridges, and forming the capacitor on these ridges may result in degradation of the voltage breakdown ($V_{bd}$) and may result in insufficient routing area below the capacitor in high density designs. Embodiments such as those disclosed herein provide a planar surface, e.g., the substrate or a uniform layer formed on the substrate, may remove or reduce these issues. Embodiments such as those disclosed herein provide for a capacitor formed on the substrate and/or between a through via and the metallization layer.

In an embodiment, a method of forming a device is provided. The method includes providing a substrate and forming a capacitor over a surface of the substrate. The capacitor is formed between a lowermost metallization layer and a higher metallization layer.

An aspect of this description relates to a method of forming a device. The method includes forming a through via extending from a surface of a substrate into the substrate. The method further includes forming a first insulating layer over the surface of the substrate. The method further includes forming a first metallization layer in the first insulating layer, the first metallization layer electrically connected to the through via. The method further includes forming a capacitor over the first metallization layer, wherein the capacitor comprises a first capacitor dielectric layer over the first metallization layer and a second capacitor dielectric layer over the first capacitor dielectric layer. The method further includes depositing a second insulating layer over the first insulating layer, wherein the capacitor is within the second insulating layer, and the second insulating layer is a continuous material. The method further includes depositing a third insulating layer over the second insulating layer. The method further includes forming a second metallization layer in the third insulating layer, wherein a bottom surface of the second metallization layer is below a bottom surface of the third insulating layer, and the second metallization layer is electrically connected to the capacitor through a via plug.

Another aspect of this description relates to a method of forming a device. The method includes forming a through via extending from a surface of a substrate into the substrate. The method further includes forming a first metallization layer electrically connected to the through via. The method further includes depositing a first etch stop layer directly over the first metallization layer. The method further includes forming a capacitor directly over the first etch stop layer. Forming the capacitor includes depositing a first conductive layer directly over the first etch stop layer. Forming the capacitor further includes depositing a first insulating layer over the first conductive layer. Forming the capacitor further includes depositing a second conductive layer over the first insulating layer. Forming the capacitor further includes etching the first insulating layer and the second conductive layer using a first etching process. Forming the capacitor further includes etching the first conductive layer using a second etching process subsequent to the first etching process.

Still another aspect of this description relates to a method of forming a device. The method includes forming a through via extending from a surface of a substrate into the substrate. Forming the through via includes etching a trench into the substrate. Forming the through via further includes depositing a liner layer in the trench. Forming the through via further includes depositing a conductive material on the liner layer, wherein the liner layer separates the conductive material from the substrate. The method further includes forming a first metallization layer electrically connected to the through via, wherein the first metallization layer directly contacts a portion of the substrate. The method further includes depositing a first etch stop layer over the first metallization layer. The method further includes forming a plurality of capacitors over the first etch stop layer, wherein a first capacitor of the plurality of capacitors shares a conductive layer with a second capacitor of the plurality of capacitors.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. As one of ordinary skill in the art will readily appreciate from the disclosure of the present disclosure, processes, machines, manufacture, compositions of matter, means, methods, or steps that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of forming a device, the method comprising:
    forming a through via extending from a surface of a substrate into the substrate;
    forming a first insulating layer over the surface of the substrate;
    forming a first metallization layer in the first insulating layer, the first metallization layer electrically connected to the through via;
    forming a capacitor over the first metallization layer, wherein the capacitor comprises a first capacitor dielectric layer over the first metallization layer and a second capacitor dielectric layer over the first capacitor dielectric layer;
    removing a portion of the substrate opposite the capacitor to expose the through via;
    depositing a second insulating layer over the first insulating layer, wherein the capacitor is within the second insulating layer;

depositing a third insulating layer over the second insulating layer; and forming a second metallization layer in the third insulating layer, wherein a bottom surface of the second metallization layer is below a bottom surface of the third insulating layer, and the second metallization layer is electrically connected to the capacitor through a via plug.

2. The method of claim 1, wherein the forming of the capacitor comprises forming two metal-insulator-metal (MIM) capacitors.

3. The method of claim 1, wherein the forming of the capacitor comprises forming a first electrode layer over the first metallization layer, a second electrode layer over the first electrode layer, and a third electrode layer over the second electrode layer.

4. The method of claim 3, wherein the forming of the first electrode layer comprises forming the first electrode layer larger in area than the second electrode layer.

5. The method of claim 3, wherein the forming of the second electrode layer comprises forming the second electrode layer larger in area than the third electrode layer.

6. The method of claim 1, further comprising:
forming a dielectric layer over the first metallization layer prior to forming the capacitor.

7. The method of claim 1, wherein the forming of the through via comprises forming the through via in a silicon interposer.

8. The method of claim 1, wherein the forming of the capacitor comprises forming a planar capacitor.

9. The method of claim 1, wherein the forming of the through via comprises forming the through via comprising copper.

10. A method of forming a device, the method comprising:
forming a through via extending from a surface of a substrate into the substrate;
forming a first metallization layer electrically connected to the through via;
depositing a first etch stop layer directly over the first metallization layer;
forming a capacitor directly over the first etch stop layer, wherein forming the capacitor comprises:
depositing a first conductive layer directly over the first etch stop layer,
depositing a first insulating layer over the first conductive layer,
depositing a second conductive layer over the first insulating layer,
etching the first insulating layer and the second conductive layer using a first etching process, and
etching the first conductive layer using a second etching process subsequent to the first etching process; and
depositing a cap layer over the first conductive layer, the first insulating layer and the second conductive layer, wherein the cap layer contacts sidewalls of the first conductive layer.

11. The method of claim 10, wherein the forming of the capacitor further comprises:
depositing a second insulating layer over the first conductive layer,
depositing a third conductive layer over the second insulating layer, and
etching the second insulating layer and the third conductive layer using a third etching processes, wherein the second etching process is subsequent to the third etching process.

12. The method of claim 10, further comprising:
depositing a first dielectric layer over the capacitor, wherein the capacitor is in the first dielectric layer;
depositing a second etch stop layer over the first dielectric layer;
depositing a second dielectric layer over the second etch stop layer; and
forming a plurality of via plugs in the first dielectric layer, wherein at least two via plugs of the plurality of via plugs electrically connect to the capacitor.

13. The method of claim 12, further comprising forming a plurality of second metallization layer features in the second dielectric layer, wherein a bottom surface of at least one second metallization layer feature of the plurality of second metallization layer features is closer to the capacitor than a bottom surface of the second etch stop layer.

14. The method of claim 10, wherein the forming of the through via comprises:
etching a trench into the substrate;
depositing a liner layer in the trench; and
depositing a conductive material on the liner layer.

15. The method of claim 14, further comprising removing a portion of the substrate opposite the capacitor to expose a surface of the through via.

16. The method of claim 10, wherein the forming of the first metallization layer comprises forming the first metallization layer in direct contact with the substrate.

17. A method of forming a device, the method comprising:
forming a through via extending from a surface of a substrate into the substrate, wherein the forming of the through via comprises:
etching a trench into the substrate,
depositing a liner layer in the trench, and
depositing a conductive material on the liner layer, wherein the liner layer separates the conductive material from the substrate;
forming a first metallization layer electrically connected to the through via, wherein the first metallization layer directly contacts a portion of the substrate;
depositing a first etch stop layer over the first metallization layer; and
forming a plurality of capacitors over the first etch stop layer, wherein a first capacitor of the plurality of capacitors shares a conductive layer with a second capacitor of the plurality of capacitors.

18. The method of claim 17, wherein the forming of the plurality of capacitors comprises:
depositing a first conductive layer directly over the first etch stop layer;
depositing a first insulating layer over the first conductive layer;
depositing a second conductive layer over the first insulating layer;
depositing a second insulating layer over the first conductive layer;
depositing a third conductive layer over the second insulating layer;
etching the second insulating layer and the third conductive layer using a first etching process;
etching the first insulating layer and the second conductive layer using a second etching process subsequent to the first etching process; and etching the first conductive layer using a third etching processes subsequent to the second etching process.

19. The method of claim 17, further comprising forming a cap layer over each capacitor of the plurality of capacitors.

20. The method of claim 17, further comprising forming a plurality of via plugs, wherein the plurality of via plugs electrically connects the first capacitor to the second capacitor.

* * * * *